United States Patent
Yilmaz et al.

(10) Patent No.: US 9,662,628 B2
(45) Date of Patent: *May 30, 2017

(54) NON-CONTAMINATING BONDING MATERIAL FOR SEGMENTED SILICON CARBIDE LINER IN A FLUIDIZED BED REACTOR

(71) Applicant: REC Silicon Inc, Moses Lake, WA (US)

(72) Inventors: Sefa Yilmaz, Moses Lake, WA (US); Matthew J. Miller, Moses Lake, WA (US); Michael V. Spangler, Soap Lake, WA (US); Barry Wemp, Moses Lake, WA (US); Stein Julsrud, Moses Lake, WA (US)

(73) Assignee: REC SILICON INC, Moses Lake, WA (US)

( * ) Notice: Subject to any disclaimer, the term of this patent is extended or adjusted under 35 U.S.C. 154(b) by 329 days.

This patent is subject to a terminal disclaimer.

(21) Appl. No.: 14/461,307

(22) Filed: Aug. 15, 2014

(65) Prior Publication Data

US 2016/0045878 A1    Feb. 18, 2016

(51) Int. Cl.
*B01J 19/02* (2006.01)
*B01J 8/18* (2006.01)
(Continued)

(52) U.S. Cl.
CPC ............... *B01J 19/02* (2013.01); *B01J 2/006* (2013.01); *B01J 2/16* (2013.01); *B01J 8/1872* (2013.01); *B01J 8/24* (2013.01); *B32B 1/08* (2013.01); *C01B 33/021* (2013.01); *C04B 35/565* (2013.01); *C04B 37/005* (2013.01); *C23C 16/24* (2013.01); *C23C 16/442* (2013.01);
(Continued)

(58) Field of Classification Search
CPC ...... B01J 8/1872; B01J 8/1818; B01J 8/1836; B01J 8/24; B01J 19/02; B01J 2208/00168; B01J 2208/00796; C23C 16/442; C01B 33/024; C01B 33/029; C01B 33/03

See application file for complete search history.

(56) References Cited

U.S. PATENT DOCUMENTS 3,012,861 A    12/1961 Ling
3,012,862 A    12/1961 Bertrand et al.
(Continued)

FOREIGN PATENT DOCUMENTS

GB        2073751 A        4/1980
KR    10-2013-0064996        6/2013
(Continued)

OTHER PUBLICATIONS

International Search Report and Written Opinion, dated May 15, 2015, issued in related International Application No. PCT/US2014/070613.

(Continued)

*Primary Examiner* — Lessanework Seifu
(74) *Attorney, Agent, or Firm* — Klarquist Sparkman, LLP

(57) ABSTRACT

Segmented silicon carbide liners for use in a fluidized bed reactor for production of polysilicon-coated granulate material are disclosed, as well as methods of making and using the segmented silicon carbide liners. Non-contaminating bonding materials for joining silicon carbide segments also are disclosed. One or more of the silicon carbide segments may be constructed of reaction-bonded silicon carbide.

20 Claims, 7 Drawing Sheets

(51) Int. Cl.

| | | |
|---|---|---|
| *B01J 8/24* | (2006.01) | |
| *C01B 37/00* | (2006.01) | |
| *C23C 16/442* | (2006.01) | |
| *B01J 2/16* | (2006.01) | |
| *C23C 16/44* | (2006.01) | |
| *C23C 16/24* | (2006.01) | |
| *B32B 1/08* | (2006.01) | |
| *C01B 33/021* | (2006.01) | |
| *C04B 35/565* | (2006.01) | |
| *C04B 37/00* | (2006.01) | |
| *F27B 15/06* | (2006.01) | |
| *F27D 1/00* | (2006.01) | |
| *F27D 1/04* | (2006.01) | |
| *B01J 2/00* | (2006.01) | |

(52) U.S. Cl.
CPC .......... *C23C 16/4404* (2013.01); *F27B 15/06* (2013.01); *F27D 1/0006* (2013.01); *F27D 1/045* (2013.01); *B01J 2208/00168* (2013.01); *C04B 2235/6562* (2013.01); *C04B 2235/72* (2013.01); *C04B 2235/725* (2013.01); *C04B 2235/727* (2013.01); *C04B 2237/062* (2013.01); *C04B 2237/083* (2013.01); *C04B 2237/09* (2013.01); *C04B 2237/365* (2013.01); *C04B 2237/52* (2013.01); *C04B 2237/78* (2013.01)

(56) References Cited

U.S. PATENT DOCUMENTS

| | | | |
|---|---|---|---|
| 3,403,043 | A | 9/1968 | Thompson |
| 4,314,525 | A | 2/1982 | Hsu et al. |
| 4,416,913 | A | 11/1983 | Ingle et al. |
| 4,820,587 | A | 4/1989 | Gautreaux et al. |
| 4,868,013 | A | 9/1989 | Allen |
| 4,883,687 | A | 11/1989 | Gautreaux et al. |
| 5,077,028 | A | 12/1991 | Age |
| 5,139,762 | A | 8/1992 | Flagella |
| 5,447,683 | A | 9/1995 | Montgomery et al. |
| 5,798,137 | A | 8/1998 | Lord et al. |
| 5,810,934 | A | 9/1998 | Lord et al. |
| 7,029,632 | B1 | 4/2006 | Weidhaus et al. |
| 8,075,692 | B2 | 12/2011 | Osborne et al. |
| 8,590,770 | B2 | 11/2013 | Chaumat et al. |
| 8,678,269 | B2 | 3/2014 | Chaumat et al. |
| 2002/0081250 | A1 | 6/2002 | Lord |
| 2002/0086530 | A1 | 7/2002 | Kim et al. |
| 2002/0102850 | A1 | 8/2002 | Kim et al. |
| 2006/0162849 | A1 | 7/2006 | Han |
| 2008/0056979 | A1 | 3/2008 | Arvidson et al. |
| 2008/0159942 | A1 | 7/2008 | Berthold et al. |
| 2008/0220166 | A1 | 9/2008 | Ege et al. |
| 2008/0241046 | A1 | 10/2008 | Hertlein et al. |
| 2008/0299291 | A1 | 12/2008 | Weidhaus et al. |
| 2009/0004090 | A1 | 1/2009 | Kim et al. |
| 2009/0324479 | A1 | 12/2009 | Kulkarni et al. |
| 2010/0044342 | A1 | 2/2010 | Kim et al. |
| 2010/0047136 | A1 | 2/2010 | Kim et al. |
| 2010/0068116 | A1 | 3/2010 | Kim et al. |
| 2010/0215562 | A1 | 8/2010 | Sanchez et al. |
| 2011/0033018 | A1 | 2/2011 | Peterson et al. |
| 2011/0033717 | A1 | 2/2011 | Peterson et al. |
| 2012/0082592 | A1 | 4/2012 | Jung et al. |
| 2012/0269686 | A1 | 10/2012 | Jung et al. |
| 2013/0064602 | A1 | 3/2013 | Chaumat et al. |
| 2014/0174353 | A1 | 6/2014 | Spangler et al. |

FOREIGN PATENT DOCUMENTS

| | | |
|---|---|---|
| WO | WO 2014-074510 | 5/2014 |
| WO | WO 2014-099502 | 6/2014 |

OTHER PUBLICATIONS

International Search Report and Written Opinion, dated May 15, 2015, issued in related International Application No. PCT/US2014/070620.

International Search Report and Written Opinion, dated May 15, 2015, issued in related International Application No. PCT/US2014/070623.

International Search Report and Written Opinion, dated May 28, 2015, issued in corresponding International Application No. PCT/US2014/070607.

Aremco Products, Inc., "*High Temperature Ceramic & Graphite Adhesives*," Technical Bulletin A2, (6 pgs), Feb. 2013.

Reparex, "*Flow Pro-Tech Liners: wear resistant elbow lining systems*" (2 pgs), Apr. 2003.

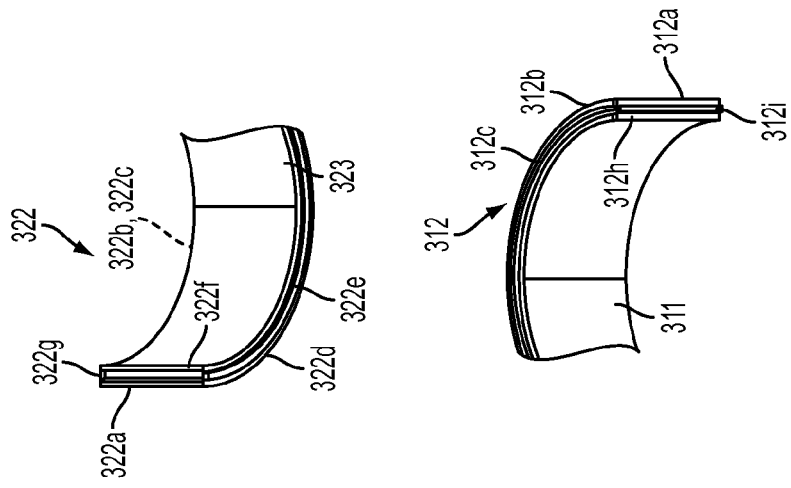
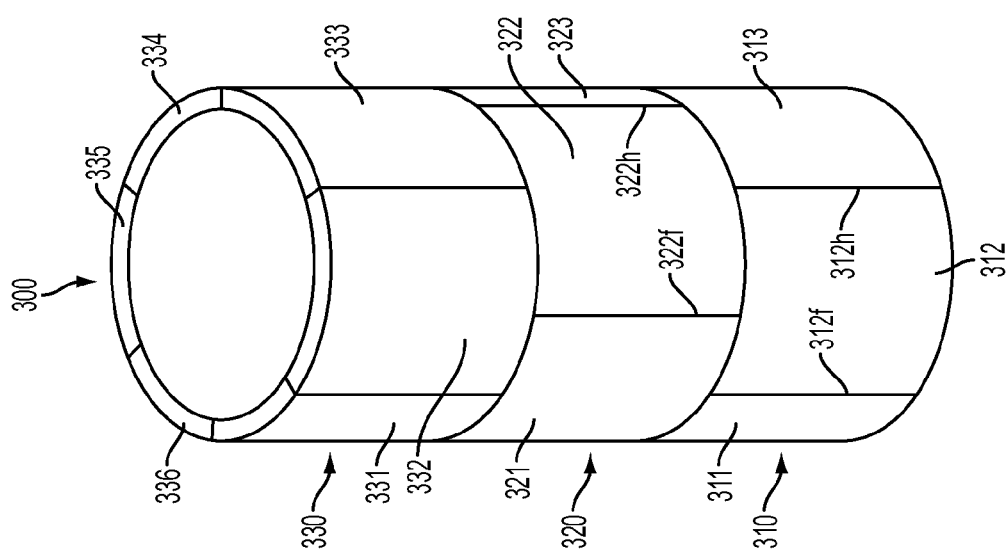
FIG. 12
FIG. 11

NON-CONTAMINATING BONDING MATERIAL FOR SEGMENTED SILICON CARBIDE LINER IN A FLUIDIZED BED REACTOR

FIELD

This disclosure concerns silicon carbide materials, bonding materials, and joint designs for making segmented silicon carbide liners for use in a fluidized bed reactor for making polysilicon-coated granulate material.

BACKGROUND

Pyrolytic decomposition of silicon-bearing gas in fluidized beds is an attractive process for producing polysilicon for the photovoltaic and semiconductor industries due to excellent mass and heat transfer, increased surface for deposition, and continuous production. Compared with a Siemens-type reactor, the fluidized bed reactor offers considerably higher production rates at a fraction of the energy consumption. The fluidized bed reactor can be highly automated to significantly decrease labor costs.

The manufacture of particulate polycrystalline silicon by a chemical vapor deposition method involving pyrolysis of a silicon-containing substance such as for example silane, disilane or halosilanes such as trichlorosilane or tetrachlorosilane in a fluidized bed reactor is well known to a person skilled in the art and exemplified by many publications including the following patents and publications: U.S. Pat. No. 8,075,692, U.S. Pat. No. 7,029,632, U.S. Pat. No. 5,810,934, U.S. Pat. No. 5,798,137, U.S. Pat. No. 5,139,762, U.S. Pat. No. 5,077,028, U.S. Pat. No. 4,883,687, U.S. Pat. No. 4,868,013, U.S. Pat. No. 4,820,587, U.S. Pat. No. 4,416,913, U.S. Pat. No. 4,314,525, U.S. Pat. No. 3,012,862, U.S. Pat. No. 3,012,861, US2010/0215562, US2010/0068116, US2010/0047136, US2010/0044342, US2009/0324479, US2008/0299291, US2009/0004090, US2008/0241046, US2008/0056979, US2008/0220166, US 2008/0159942, US2002/0102850, US2002/0086530, and US2002/0081250.

Silicon is deposited on particles in a reactor by decomposition of a silicon-bearing gas selected from the group consisting of silane ($SiH_4$), disilane ($Si_2H_6$), higher order silanes ($Si_nH_{2n+2}$), dichlorosilane ($SiH_2Cl_2$), trichlorosilane ($SiHCl_3$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof. The silicon-bearing gas may be mixed with one or more halogen-containing gases, defined as any of the group consisting of chlorine ($Cl_2$), hydrogen chloride (HCl), bromine ($Br_2$), hydrogen bromide (HBr), iodine ($I_2$), hydrogen iodide (HI), and mixtures thereof. The silicon-bearing gas may also be mixed with one or more other gases, such as hydrogen ($H_2$) and/or one or more inert gases selected from nitrogen ($N_2$), helium (He), argon (Ar), and neon (Ne). In particular embodiments, the silicon-bearing gas is silane, and the silane is mixed with hydrogen. The silicon-bearing gas, along with any accompanying hydrogen, halogen-containing gases and/or inert gases, is introduced into a fluidized bed reactor and thermally decomposed within the reactor to produce silicon which deposits upon seed particles inside the reactor.

A common problem in fluidized bed reactors is contamination of silicon-coated particles in the fluid bed at high operating temperatures by materials used to construct the reactor and its components. For example, nickel has been shown to diffuse into a silicon layer (e.g., on a silicon-coated particle) from the base metal in some nickel alloys used to construct reactor parts. Similar problems arise in fluidized bed reactors configured for pyrolytic decomposition of a germanium-bearing gas to produce germanium-coated particles.

SUMMARY

This disclosure concerns embodiments of silicon carbide materials, bonding materials, and joint designs for making segmented silicon carbide liners for use in a fluidized bed reactor (FBR) for making polysilicon.

Silicon carbide liners for a FBR for production of polysilicon-coated granulate material have an inwardly facing surface that at least partially defines a reaction chamber. At least a portion of the liner may comprise reaction-bonded SiC, which has, on at least a portion of the liner's inwardly facing surface, a surface contamination level of less than 3% atomic of dopants, and less than 5% atomic of foreign metals. In one embodiment, the portion has a surface contamination level of less than 3% atomic of dopants B, Al, Ga, Be, Sc, N, P, As, Ti, and Cr, combined. In an independent embodiment, the portion has a surface contamination level of less than 1% atomic of phosphorus and less than 1% atomic of boron.

In any or all of the above embodiments, the reaction-bonded SiC may have a mobile metal concentration sufficiently low that (i) the polysilicon-coated granulate material produced in the FBR has a mobile metal contamination level of ≤1 ppbw, or (ii) a mobile metal partial pressure in the FBR is less than 0.1 Pa during operation of the FBR, or (iii) the mobile metal contamination is ≤1 ppbw and the mobile metal partial pressure in the FBR is less than 0.1 Pa during operation. The mobile metals may include aluminum, chromium, iron, copper, magnesium, calcium, sodium, nickel, tin, zinc, and molybdenum. In any or all of the above embodiments, the reaction-bonded SiC may be prepared from solar-grade or electronic-grade silicon.

SiC liners for use in an FBR may be constructed from a plurality of SiC segments bonded together with a bonding material comprising a lithium salt. One or more of the segments may comprise reaction-bonded SiC. The bonding material, before curing, may be an aqueous slurry comprising 2500-5000 ppm lithium as lithium silicate and silicon carbide particles. In any or all of the above embodiments, the bonding material may further comprise aluminum silicate. In any or all of the above embodiments, the bonding material may have a viscosity from 3.5 Pa·s to 21 Pa·s at 20° C. In any or all of the above embodiments, the bonding material, after curing, may comprise 0.4-0.7 wt % lithium as lithium aluminum silicate and 93-97 wt % silicon carbide particles.

A process for constructing a silicon carbide liner from SiC segments includes (i) forming at least one coated edge surface by applying a bonding material as disclosed herein to at least a portion of an edge surface of a first silicon carbide segment; (2) bringing the at least a portion of the edge surface of the first silicon carbide segment into abutment with at least a portion of an edge surface of a second silicon carbide segment with at least a portion of the bonding material positioned between the abutting edge surfaces of the first silicon carbide segment and the second silicon carbide segment; and (3) applying heat to the bonding material, in an atmosphere devoid of hydrocarbons, to form bonded first and second silicon carbide segments. Applying heat may comprise exposing the abutted first and second silicon carbide segments to an atmosphere at a first temperature T1 for a first period of time, increasing the temperature to a temperature T2, and exposing the abutted first and second silicon carbide segments to the second temperature T2, wherein T2>T1, for a second period of time to cure the bonding material. In any or all of the above embodiments, the abutted SiC segments may be allowed to dry for an initial period of time at ambient temperature in air before applying heat.

In any or all of the above embodiments, when two SiC segments are joined with the bonding material, one of an edge surface of the first SiC segment and an adjacent edge surface of the second SiC segment may define a female joint portion. The other of the edge surface of the first SiC segment and the adjacent edge surface of the second SiC segment may define a male joint portion cooperatively dimensioned to fit with the female joint portion. The male joint portion has smaller dimensions than the female joint portion, thereby forming a space when the two SiC segments are abutted. The bonding material is disposed within the space.

In some embodiments, a segmented SiC liner includes a plurality of vertically stacked SiC segments. A first SiC segment has an upper edge surface defining one of an upwardly opening first segment depression or an upwardly extending first segment protrusion. A second SiC segment located above and abutted to the first segment has a lower edge surface defining a downwardly opening second segment depression if the first segment upper edge surface defines an upwardly extending first segment protrusion or a downwardly extending second segment protrusion if the first segment upper edge surface defines an upwardly opening first segment depression. The protrusion is received within the depression. The protrusion has smaller dimensions than the depression such that the surface of the depression is spaced apart from the surface of the protrusion, and a space is located between the depression and the protrusion. A volume of bonding material is disposed within the space.

Each of the first and second SiC segments may define a tubular wall. The first tubular wall has an annular upper surface, the upper edge surface being at least a portion thereof, and the first segment depression is a groove extending along at least a portion of the upper edge surface or the first segment protrusion extends upwardly from and along at least a portion of the first segment upper edge surface. The groove or the protrusion may extend around the entire annular upper surface. The second tubular wall has an annular lower surface, the lower edge surface being at least a portion thereof, and the second segment depression is a protrusion extending downwardly from and along at least a portion of the lower edge surface or the second segment depression is a groove that is defined by and extends along at least a portion of the second segment lower edge surface. The protrusion or depression may extend around the entire annular lower surface. In any or all of these above embodiments, the second SiC segment may include an upper edge surface that defines an upwardly opening second segment depression.

In any or all of the above embodiments, the segmented SiC liner may include one or more additional SiC segments. Each additional SiC segment may comprise an upper edge surface defining an upwardly opening depression and a lower edge surface defining a downwardly extending protrusion. The protrusion is received within an upper edge surface depression of an adjacent SiC segment located below and abutted to the additional SiC segment, the protrusion having smaller dimensions than the depression of the adjacent SiC segment such that a space is located between the protrusion and the depression. A volume of the bonding material is disposed within the space.

In any or all of the above embodiments, the segmented SiC liner may further include a terminal SiC segment, which is the uppermost segment of the liner. In some embodiments, the terminal SiC segment is located above and abutted to the second SiC segment. Alternatively, it may be located above and abutted to an additional SiC segment, which is located above the second SiC segment. In some embodiments, the terminal SiC segment has a lower edge surface defining a downwardly extending terminal segment protrusion received within a depression of a SiC segment located adjacent to and below the terminal SiC segment, the protrusion having smaller dimensions than the depression such that a space is located between the protrusion and the depression. A volume of the bonding material is disposed within the space.

In some embodiments, a segmented SiC liner includes a tubular wall comprising a plurality of laterally joined SiC segments, each laterally joined SiC segment having lateral edges and an outer surface that is a portion of the tubular wall outer surface. A volume of bonding material is disposed between abutting lateral edges of adjacent SiC segments.

In one embodiment, each SiC segment of the tubular wall comprises a first lateral edge surface defining a laterally opening depression along at least a portion of the length of the first lateral edge surface, and a second lateral edge surface defining a laterally extending protrusion along at least a portion of the second lateral edge surface. The protrusion has smaller dimensions than the depression such that when a first lateral edge of a first SiC segment is abutted to a second lateral edge of an adjacent SiC segment, the surface of the depression is spaced apart from the surface of the protrusion and a space is located between the depression and the protrusion. The volume of bonding material is disposed within the space.

In another embodiment, the tubular wall comprises laterally joined alternating first and second SiC segments. Each first SiC segment comprises a first lateral edge surface defining a laterally opening depression along at least a portion of the length of the first lateral edge surface. Each second SiC segment comprises a second lateral edge surface defining a laterally extending protrusion along at least a portion of the length of the second lateral edge surface, the protrusion having smaller dimensions than the first lateral edge surface depression such that, when a first lateral edge of the first segment is abutted to the second lateral edge. The protrusion has smaller dimensions than the depression such that, when the first lateral edge of the first segment is abutted to the second lateral edge, the surface of the first segment depression is spaced apart from the surface of the second segment protrusion and a space is located between the first segment depression and the second segment protrusion, and the volume of bonding material is disposed within the space.

A segmented SiC liner may comprise vertically stacked first and second tubular walls, each tubular wall comprising a plurality of laterally joined SiC segments as described above. A volume of bonding material is disposed between adjacent laterally joined SiC segments of each tubular wall. Additionally, a volume of bonding material is disposed between the first and second tubular walls. In such embodiments, each SiC segment of the first tubular wall further comprises an upper edge surface defining an upwardly opening first tubular wall segment depression. Each SiC segment of the second tubular wall further comprises a lower edge surface defining a downwardly extending second tubular wall segment protrusion received within the first tubular wall segment depression. The second tubular wall segment protrusion has smaller dimensions than the first tubular wall segment depression, such that a space is located between the protrusion and the depression when the first and second tubular wall segments are abutted.

In some of the above embodiments, each second tubular wall segment further comprises an upper edge surface that defines an upwardly opening depression. In such embodiments, the segmented SiC liner may further comprise one or more additional tubular walls, each additional tubular wall comprising a plurality of laterally joined additional SiC segments. Each additional SiC segment comprises a first lateral edge defining a laterally opening depression along at least a portion of its length, a second lateral edge defining a laterally extending protrusion along at least a portion of its length, an upper edge surface defining an upwardly opening depression, and a lower edge surface defining a downwardly extending protrusion.

In any or all of the above embodiments, the segmented SiC liner may further comprise a terminal tubular wall comprising a plurality of laterally joined terminal SiC segments. Each terminal SiC segment comprises a first lateral edge defining a laterally opening depression along at least a portion of its length, a second lateral edge defining a laterally extending protrusion along at least a portion of its length, and a lower edge surface defining a downwardly extending protrusion received in an upwardly opening depression of a tubular wall segment located below the terminal SiC segment.

In any or all of the above embodiments, at least one retaining member may extend around the cylindrical outer surface of each tubular wall comprising a plurality of laterally joined SiC segments. The retaining member may have a linear coefficient of thermal expansion similar to SiC, such as a linear coefficient of thermal expansion ranging from $2 \times 10^{-6}$/K to $6 \times 10^{-6}$/K. In some embodiments, the retaining member is constructed of molybdenum or a molybdenum alloy.

A fluidized bed reactor for production of polysilicon-coated granulate material comprises a vessel having an outer wall, and a silicon carbide liner as disclosed herein, the liner being positioned outwardly of the outer wall such that the inner surface of the liner defines a portion of a reaction chamber. The SiC liner may be at least partially constructed of reaction-bonded SiC. The SiC liner may be constructed from SiC segments. In any or all of the above embodiments, the FBR may further comprise at least one heater positioned between the outer wall and the segmented silicon carbide liner, at least one inlet having an opening positioned to admit a primary gas comprising a silicon-bearing gas into the reaction chamber, a plurality of fluidization gas inlets, wherein each fluidization gas inlet has an outlet opening into the reaction chamber, and at least one outlet for removing silicon-coated product particles from the vessel.

The foregoing and other features and advantages of the invention will become more apparent from the following detailed description, which proceeds with reference to the accompanying figures.

BRIEF DESCRIPTION OF THE DRAWINGS

FIG. 11 is a schematic oblique view of a segmented liner including plural stacked tubular wall segments, each tubular wall segment including plural laterally abutted segments.

FIG. 12 is a schematic exploded view of portions of two abutting stacked wall segments.

DETAILED DESCRIPTION

Figure 1:
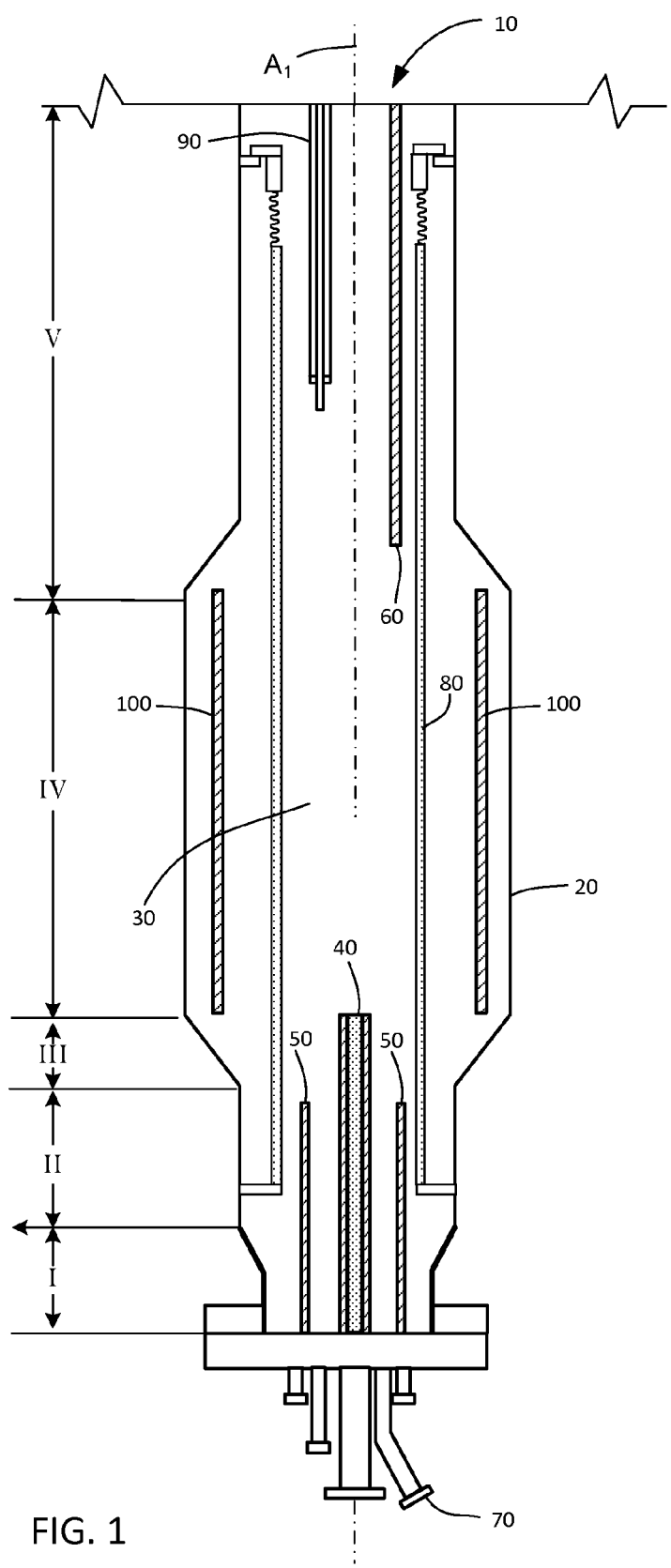
FIG. 1 is a schematic cross-sectional elevational view of a fluidized bed reactor.

This disclosure concerns embodiments of silicon carbide materials, bonding materials, and joint designs for making segmented silicon carbide liners for use in a fluidized bed reactor for making polysilicon. A fluidized bed reactor (FBR) for making granular polysilicon may include an inwardly-facing liner in the reaction chamber. The liner prevents polysilicon granule contamination arising from reactor components positioned outside the liner. The liner is constructed of a non-contaminating material, such as silicon carbide.

However, manufacturing and reactor design limitations may not allow for a single-piece silicon carbide liner to be prepared. For example, it may not be possible to make a sufficiently large, single-piece silicon carbide liner for a commercial-scale FBR. Accordingly, a silicon carbide liner may be assembled from a plurality of silicon carbide segments. A need exists for joint designs and bonding materials suitable for constructing segmented silicon carbide liners. Additionally, the silicon carbide purity is a consideration. For example, some silicon carbides are prepared using boron nitride additives, which produce undesirable boron contamination of polysilicon granules under reaction conditions within the FBR.

I. DEFINITIONS AND ABBREVIATIONS

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, percentages, temperatures, times, and so forth, as used in the specification or claims are to be understood as being modified by the term "about." Accordingly, unless otherwise indicated, implicitly or explicitly, the numerical parameters set forth are approximations that may depend on the desired properties sought, limits of detection under standard test conditions/methods, or both. When directly and explicitly distinguishing embodiments from discussed prior art, the embodiment numbers are not approximates unless the word "about" is recited.

Unless otherwise indicated, all percentages referring to a composition or material are understood to be a percent by weight, i.e., % (w/w). For example, a composition comprising 2% lithium includes 2 g lithium per 100 g of the composition. Where expressly noted, percentages referring to a substance may be atomic percentages, i.e., the number of atoms per 100 atoms. For example, a substance comprising 1% atomic phosphorus includes one phosphorus atom per one hundred atoms in the substance. Similarly, concentrations expressed as parts per million (ppm) or parts per billion (ppb) are understood to be in terms of weight unless otherwise indicated, e.g., 1 ppm=1 mg/kg. Where expressly noted, concentrations may be expressed as ppma (ppm atomic) or ppba, e.g., 1 ppma=1 atom in 1,000,000 atoms.

In order to facilitate review of the various embodiments of the disclosure, the following explanations of specific terms are provided:

Acceptor: An atom capable of accepting an electron (p-type dopants), thus generating holes in the valence band of silicon atoms; acceptors include Group III elements, such as B, Al, Ga, also Be, Sc.

Atomic percent: The percent of atoms in a substance, i.e., the number of atoms of a particular element per 100 atoms of the substance.

Donor: An atom capable of donating an electron to serve as a charge carrier in the silicon carbide (n-type dopants); the remaining four electrons coordinate with silicon; donors include Group V elements, such as N, P, As; also Ti, Cr, Sb.

Dopant: An impurity introduced into a substance to modulate its properties; acceptor and donor elements replace elements in the crystal lattice of a material, e.g., a semiconductor.

Electronic-grade silicon: Electronic-grade, or semiconductor-grade, silicon has a purity of at least 99.99999 wt %, such as a purity from 99.9999-99.9999999 wt % silicon. The percent purity may not include certain contaminants, such as carbon and oxygen. Electronic-grade silicon typically includes ≤0.3 ppba B, ≤0.3 ppba P, ≤0.5 ppma C, <50 ppba bulk metals (e.g., Ti, Cr, Fe, Ni, Cu, Zn, Mo, Na, K, Ca), ≤20 ppbw surface metals, ≤8 ppbw Cr, ≤8 ppbw Ni, ≤8 ppba Na. In some instances, electronic-grade silicon includes ≤0.15 ppba B, ≤0.15 ppba P, ≤0.4 ppma C, ≤10 ppbw bulk metals, ≤0.8 ppbw surface metals, ≤0.2 ppbw Cr, ≤0.2 ppbw Ni, ≤0.2 ppba Na.

Foreign metal: As used herein, the term "foreign metal" refers to any metal present in silicon carbide, other than silicon.

LCTE: Linear coefficient of thermal expansion, a measure of the fractional change in length of a material per degree of temperature change.

Mobile metal: As used herein, the term "mobile metal" refers to a metal atom or metal ion that may migrate out of a substance (e.g., out of silicon carbide) or vaporize at operating conditions of a fluidized bed reactor and contribute to product contamination. Mobile metals include Group IA metals, Group IIA metals, Group IIIA metals, transition metals, and cations thereof.

Reaction-bonded silicon carbide (RBSiC): Reaction-bonded silicon carbide may be produced by reacting porous carbon or graphite with molten silicon. Alternatively, RBSiC may be formed by exposing a finely divided mixture of silicon carbide and carbon particles to liquid or vaporized silicon at high temperatures whereby the silicon reacts with the carbon to form additional silicon carbide, which bonds the original silicon carbide particles together. RBSiC often contains a molar excess of unreacted silicon, which fills spaces between silicon carbide particles, and may be referred to as "siliconized silicon carbide." In some processes, a plasticizer may be used during the manufacturing process and subsequently burned off.

Solar-grade silicon: Silicon having a purity of at least 99.999 wt % atomic. Furthermore, solar-grade silicon typically has specified concentrations of elements that affect solar performance. According to Semiconductor Equipment and Materials International (SEMI) standard PV017-0611, solar-grade silicon may be designated as grade I-IV. For example, Grade IV solar-grade silicon contains <1000 ppba acceptors (B, Al), <720 ppba donors (P, As, Sb), <100 ppma carbon, <200 ppba transition metals (Ti, Cr, Fe, Ni, Cu, Zn, Mo), and <4000 ppba alkali and earth alkali metals (Na, K, Ca). Grade I solar-grade silicon contains <1 ppba acceptors, <1 ppba donors, <0.3 ppma C, <10 ppba transition metals, and <10 ppba alkali and earth alkali metals.

Surface contamination: Surface contamination refers to contamination (i.e., undesired elements, ions, or compounds) within surface layers of a material, such as a silicon carbide segment. Surface layers include the outermost atomic or molecular layer of the material as well as atomic/molecular layers extending inwardly to a depth of 25 μm in the material. Surface contamination may be determined by any suitable method including, but not limited to, scanning electron microscopy, energy dispersive x-ray spectroscopy, or secondary ion mass spectrometry.

II. FLUIDIZED BED REACTOR

FIG. 1 is a simplified schematic diagram of a fluidized bed reactor 10 for producing silicon-coated particles. The reactor 10 extends generally vertically, has an outer wall 20, a central axis $A_1$, and may have cross-sectional dimensions that are different at different elevations. The reactor shown in FIG. 1 has five regions, I-V, of differing cross-sectional dimensions at various elevations. The reaction chamber may be defined by walls of different cross-sectional dimensions, which may cause the upward flow of gas through the reactor to be at different velocities at different elevations.

Silicon-coated particles are grown by pyrolytic decomposition of a silicon-bearing gas within a reactor chamber 30 and deposition of silicon onto particles within a fluidized bed. One or more inlet tubes 40 are provided to admit a primary gas, e.g., a silicon-bearing gas or a mixture of silicon-bearing gas, hydrogen and/or an inert gas (e.g., helium, argon) into the reactor chamber 30. The reactor 10 further includes one or more fluidization gas inlet tubes 50. Additional hydrogen and/or inert gas can be delivered into the reactor through fluidization inlet tube(s) 50 to provide sufficient gas flow to fluidize the particles within the reactor bed. At the outset of production and during normal operations, seed particles are introduced into reactor 10 through a seed inlet tube 60. Silicon-coated particles are harvested by removal from reactor 10 through one or more product outlet tubes 70. A liner 80 may extend vertically through the reactor 10. In some arrangements, the liner is concentric with the reactor wall 20. The illustrated liner 80 is generally a circular cylinder in shape, i.e., a tubular liner. In some embodiments, a probe assembly 90 extends into the reactor chamber 30. The reactor 10 further includes one or more heaters. In some embodiments, the reactor includes a circular array of heaters 100 located concentrically around reactor chamber 30 between liner 80 and outer wall 20. In some systems, a plurality of radiant heaters 100 is utilized with the heaters 100 spaced equidistant from one another.

The temperature in the reactor differs in various portions of the reactor. For example, when operating with silane as the silicon-containing compound from which silicon is to be released in the manufacture of polysilicon particles, the temperature in region I, i.e., the bottom zone, is ambient temperature to 100° C. (FIG. 1). In region II, i.e., the cooling zone, the temperature typically ranges from 50-700° C. In region III, the intermediate zone, the temperature is substantially the same as in region IV. The central portion of region IV, i.e., the reaction and splash zone, is maintained at 620-760° C., and advantageously at 660-690° C., with the temperature increasing to 700-900° C. near the walls of region IV, i.e., the radiant zone. The upper portion of region V, i.e., the quench zone, has a temperature of 400-450° C.

Polysilicon-coated granulate particles are produced by flowing a silicon-containing gas through the fluidized bed reactor containing a seed particle within the reactor chamber under conditions sufficient to effect pyrolysis of the silicon-containing gas and deposition of a polycrystalline silicon layer on the seed particle to form a polysilicon-coated particle.

Surfaces in contact with seed particles and/or silicon-coated particles in reactor chamber 30 can be a source of product contamination. Soft metals, for example, are prone to galling from contact with fluidized silicon-coated particles. The term "galling" refers to wear and transfer of material between metallic surfaces that are in direct contact with relative movement. Silicon-coated particles can be contaminated by the transferred metal. Galling also causes wear and tear of metal components, leading to reactor downtime as components are replaced or the metal surfaces are ground or machined to return them to condition for reuse. Thus, there is a need for improved reactor surfaces that will better withstand reactor conditions, reduce product contamination, or both.

A non-contaminating liner has an inwardly facing surface that at least partially defines the reaction chamber and reduces product contamination. The liner prevents polysilicon-coated granule contamination arising from reactor components positioned outside the liner. Suitable liner materials include, but are not limited to non-contaminating silicon carbides. Silicon carbide liners, however, can present challenges when working with commercial-scale fluidized bed reactors (FBRs). For example, manufacturing and/or reactor design limitations may preclude using a single-piece SiC liner. Accordingly, a SiC liner may be constructed of segments that are joined to form the liner.

The SiC liner extends through at least a portion of region IV, i.e., the reaction and splash zone, of the FBR. Advantageously, the liner extends through the length of region IV. The liner may further extend through regions I, II, III, V, or any combination thereof. In some examples, the liner extends through at least a portion of region II, region III, region IV, and at least a portion of region V as shown in FIG. 1.

III. SILICON CARBIDE LINERS

Silicon carbide liners for fluidized bed reactors advantageously are constructed from SiC that does not cause significant product contamination when the SiC liner is exposed to operating conditions of the FBR. In some embodiments, at least a portion of the liner is constructed from reaction-bonded SiC (RBSiC).

In some embodiments, an inwardly facing surface of the portion of the liner comprising RBSiC has surface contamination levels of less than 3% atomic of dopants and less than 5% atomic of foreign metals. Dopants in RBSiC include B, Al, Ga, Be, Sc, N, P, As, Ti, Cr, or any combination thereof. In some embodiments, the portion has a surface contamination level of less than 3% atomic of dopants B, Al, Ga, Be, Sc, N, P, As, Ti, and Cr, combined. The inwardly facing surface of the liner portion constructed of RBSiC advantageously has a surface contamination level comprising less than 1% atomic of phosphorus and less than 1% atomic of boron.

The RBSiC desirably has a mobile metal concentration sufficiently low that the polysilicon-coated granulate material produced in the fluidized bed reactor has a mobile metal contamination level of ≤1 ppbw as measured by inductively coupled plasma mass spectroscopy (ICPMS) and based on the entire mass of the granule. For aluminum, a contamination level of 1 ppbw or greater might result when aluminum is present in the RBSiC at a sufficient concentration that an aluminum partial pressure in the FBR is at least 1 Pa, e.g., at least 1 Pa at operating conditions within the FBR. For heavier elements (e.g., Fe, Cr), undesirable product contamination levels may occur at lower partial pressures. In some embodiments, the RBSiC has a mobile metal concentration sufficiently low that a total mobile metal partial pressure in the FBR is less than 0.1 Pa for the sum of all mobile metal partial pressures during operation of the FBR. The mobile metals include aluminum, chromium, iron, copper, magnesium, calcium, sodium, nickel, tin, zinc, and molybdenum. Partial pressure is calculated based on the contamination level measured by ICPMS in the granulate material. Vapor pressures of metals can be estimated by the Antoine equation:

$$\log p(atm) = A + B \times T^{-1} + C \times \log(T) + D \times T \times 10^{-3},$$

where p is metal vapor pressure (atm), T is temperature in Kelvins, A, B, C, and D are component-specific constants (Alcock, *Thermochemical Processes Principles and Models*, Butterworth-Heinemann, 2001, p. 38). The calculation assumes that all the vapors of the particular impurity are incorporated into the granulate material. The impurity vapors may be assumed to obey the ideal gas law. Moles or mass of the impurity in the reactor is calculated with the ideal gas law. A concentration in the granulate material is then calculated using the total mass of granulate material in the FBR.

In some embodiments, the RBSiC is siliconized SiC produced by exposing a finely divided mixture of silicon carbide and carbon particles to liquid or vaporized silicon at high temperatures. In certain embodiments, the liquid or vaporized silicon is solar-grade or electronic-grade silicon.

IV. SEGMENTED LINERS

A. Vertically Stacked Segments

Figure 2:
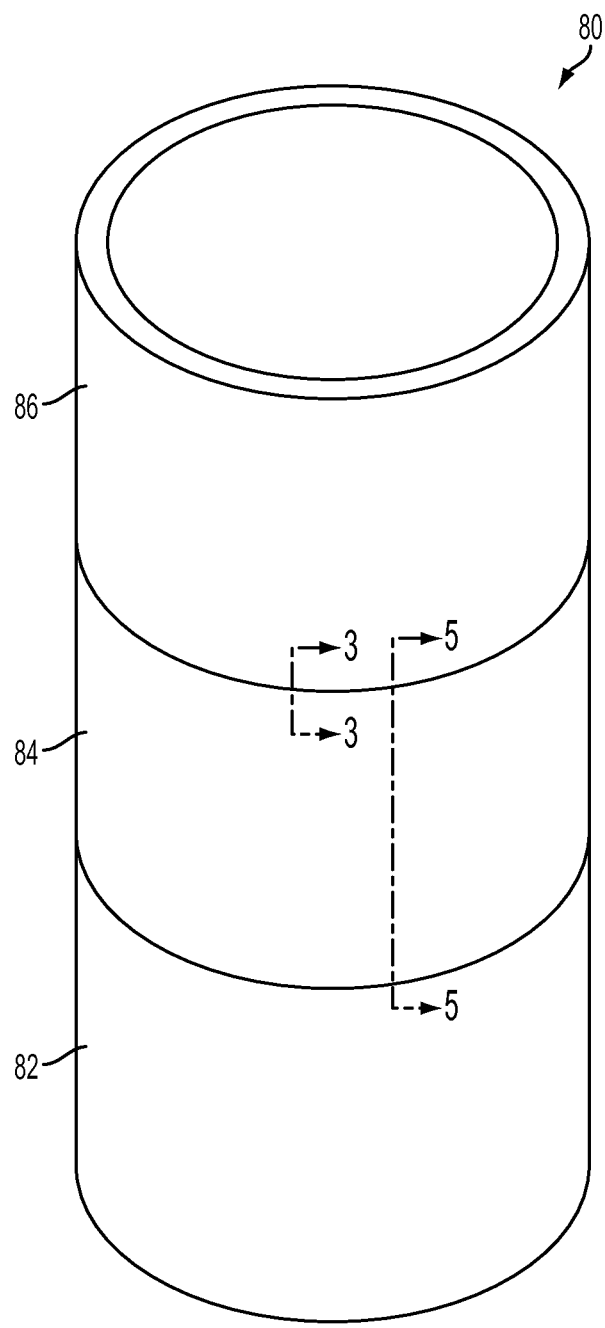
FIG. 2 is a schematic oblique view of a segmented liner including plural stacked segments.
Figure 3:
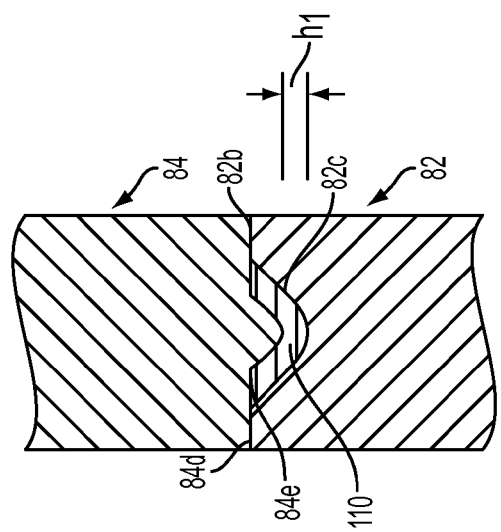
FIG. 3 is a schematic partial cross-sectional view, taken along line 3-3 of FIG. 2, showing the boundary between two vertically abutted silicon carbide segments.

A segmented silicon carbide liner 80 for use in a fluidized bed reactor for production of polysilicon-coated granulate material may comprise a first SiC segment 82, a second SiC segment 84 stacked on top of the first segment 82, and a volume of bonding material 110 disposed between abutting edge surfaces of the first and second SiC segments (FIGS. 2 and 3). The first, or lower, SiC segment 82, also referred to as an initiator segment, has a first segment upper edge surface 82b defining an upwardly opening first segment depression 82c. In some embodiments, the first SiC segment has a lower edge surface that is flat (i.e., the lower edge surface does not include a depression or a protrusion), thereby facilitating a gas-tight seal when the liner 80 is inserted into the fluidized bed reactor chamber. The second SiC segment 84 is located above and abutted to the first SiC segment 82. The second SiC segment 84 has a second segment lower edge surface 84d defining a downwardly extending second segment protrusion 84e received within the first segment depression 82c. The first segment depression 82c and second segment protrusion 84e are female and male joint portions, respectively. In some examples, the joint portions have a tongue-and-groove configuration, wherein the first segment depression 82c corresponds to the groove and the second segment protrusion 84e corresponds to the tongue.

The second segment protrusion 84e has smaller dimensions than the first segment depression such that, when the protrusion 84e is received in the depression 82c, the surface of the first segment depression is spaced apart from the surface of the second segment protrusion and a space is located between the second segment protrusion 84e and the first segment depression 82c. The space has a suitable size to accommodate a volume of bonding material. Although the bonding material can bond the first SiC segment to the second SiC segment in the absence of a space, the space facilitates even distribution of the bonding material and allows excess bonding material to flow out and be removed as pressure is applied to the SiC segments. In the absence of a space between the depression and protrusion, the bonding material may not distribute evenly, creating high and low points. A high area of bonding material with a small contact area creates an area of high pressure or stress as the SiC segments are brought into abutment, which may cause the SiC segment(s) to break. In some examples, the space has a height $h_1$, measured vertically, of 0.2-0.8 mm, such as a height of 0.4-0.6 mm. The bonding material 110 is disposed within the space between the second segment protrusion 84e and the first segment depression 82c. In some embodiments, the bonding material comprises 0.4-0.7 wt % lithium as lithium aluminum silicate and silicon carbide as described infra. The bonding material may further comprise aluminum silicate.

A person of ordinary skill in the art understands that, in an alternate arrangement, the protrusion may extend upward from the lower segment and the depression may be located on the lower edge surface of the upper segment, i.e., the first segment upper edge surface 82b may define an upwardly extending first segment protrusion 82c and the second segment lower edge surface 84d may define a downwardly opening depression 84e. However, the arrangement illustrated in FIG. 3 is more convenient for retaining the uncured bonding material, which may be a slurry or a paste.

Figure 4:
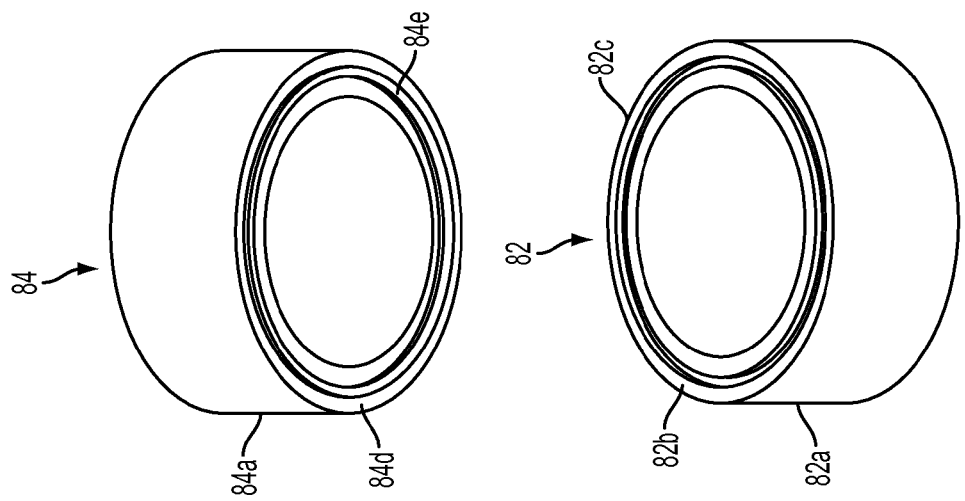
FIG. 4 is a schematic exploded view of a first silicon carbide segment and a second silicon carbide segment of the segmented liner of FIG. 2.

In some examples, the first SiC segment 82 comprises a first tubular wall 82a having an annular upper surface 82b (FIG. 4). The first segment upper edge surface 82b is at least a portion of the annular upper surface, and the first segment depression 82c is a groove that is defined by and extends along at least a portion of the first segment upper edge surface 82b. In some embodiments, the depression 82c extends as a ring around the entire annular upper surface. The second SiC segment 84 comprises a first tubular wall 84a having an annular lower surface 84d (FIG. 4). The second segment lower edge surface 84d is at least a portion of the annular lower surface, and the second segment protrusion 84e extends downwardly from and along at least a portion of the second segment lower edge surface 84d. In some embodiments, the protrusion 84e extends as a ring around the entire annular lower surface 84d.

In some embodiments, the segmented silicon carbide liner comprises one or more additional silicon carbide segments. In the example shown in FIG. 2, the liner 80 comprises three silicon carbide segments 82, 84, 86. Each of the segments may have a tubular, or substantially cylindrical, configuration. In some arrangements, each of the segments has the same cross-sectional area, forming a vertical cylinder when stacked. However, it is not required that all of the segments have identical cross-sectional areas. Instead, the segments may vary in cross-sectional area such that the segmented liner may have different diameters at different heights. A person of ordinary skill in the art understands that the segmented liner may include two, three, four, or more than four segments. The number of SiC segments is determined, at least in part, by the desired height of the liner and the height of the individual segments. Manufacturing limitations may determine the height of individual SiC segments.

Figure 5:
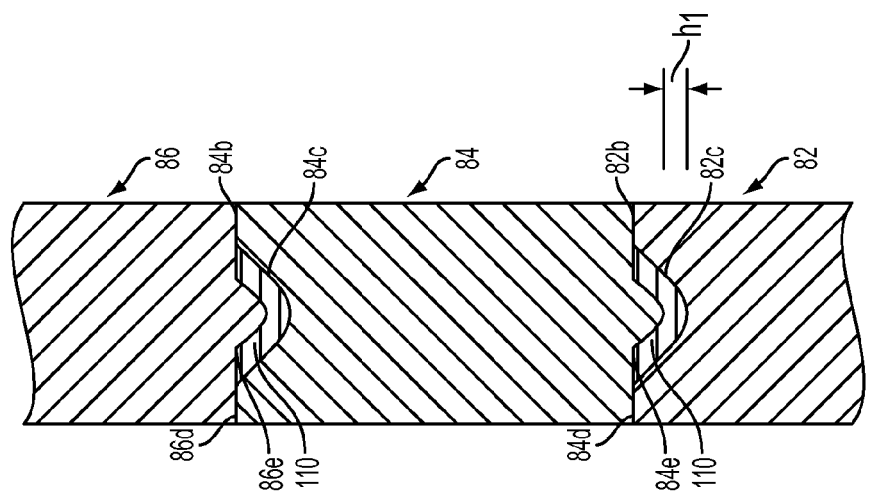
FIG. 5 is a schematic cross-sectional view, taken along line 5-5 of FIG. 2, of a portion of a segmented liner illustrating three vertically abutted silicon carbide segments.

As shown in FIG. 5, a SiC segment 84 positioned between two adjacent SiC segments 82, 86 has an upper edge surface 84b defining an upwardly opening segment depression 84c and a lower edge surface 84d defining a downwardly extending segment protrusion 84e. The protrusion 84e is received within an upper edge surface depression 82c defined by an upper edge surface 82b of an adjacent SiC segment 82 located below and abutted to the SiC segment 84. The protrusion 84e has smaller dimensions than the depression 82c of the adjacent silicon carbide segment 82 such that the surface of the adjacent silicon carbide segment depression 82c is spaced apart from the surface of the protrusion 84e and a space is located between the protrusion 84e and the depression 82c of the adjacent silicon carbide segment 82. A volume of bonding material 110 is disposed within the space. Similarly the depression 84c receives a protrusion 86e defined by a lower edge surface 86d of an adjacent SiC segment 86 located above and abutted to the SiC segment 84. The protrusion 86e has smaller dimensions than the depression 84c such that the surface of the depression 84c is spaced apart from the surface of the protrusion 86e and a space is located between the protrusion 86e and the depression 84c. A volume of bonding material 110 is disposed within the space.

In some embodiments, a segmented SiC liner comprises a plurality of vertically stacked SiC segments alternating between segments having protrusions on both of the upper and lower edge surfaces and segments having depressions on both of the upper and lower edge surfaces.

Figure 6:
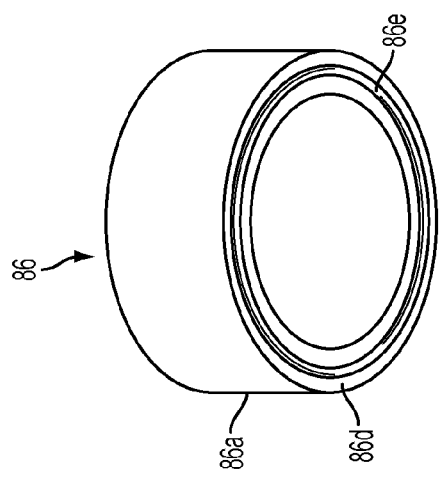
FIG. 6 is a schematic elevational view of a terminal silicon carbide segment.

In some examples, a segmented SiC liner 80 includes an uppermost or terminal SiC segment, e.g., segment 86 of FIG. 2 that has a tongue or groove only on the downwardly facing annular surface. FIGS. 5 and 6 show a top terminal segment 86 that has a terminal segment lower edge surface 86d defining a downwardly extending terminal segment protrusion 86e. The terminal segment protrusion 86e is received within an adjacent segment depression, e.g., second segment depression 84c, and has smaller dimensions than the adjacent segment depression such that the surface of the adjacent segment depression is spaced apart from the surface of the terminal segment protrusion 86e and a space is located between the terminal segment protrusion 86e and the adjacent segment depression. A volume of bonding material 110 is disposed within the space. The terminal SiC segment 86 need not have an upper edge surface defining a depression or protrusion; instead the upper edge surface may be substantially planar as shown in FIG. 2. Although FIGS. 2 and 5 illustrate terminal SiC segment 86 abutted to second SiC segment 84, a person of ordinary skill in the art understands that one or more additional SiC segments may be stacked in layers between segments 84 and 86. Advantageously, each additional segment has a configuration substantially similar to segment 84 with an upwardly opening segment depression defined by its upper edge surface and a downwardly extending segment protrusion defined by its lower edge surface. Terminal SiC segment 86 is located above, abutted to, and rests on the adjacent SiC segment immediately below it.

In some embodiments, one or more of the silicon carbide segments is formed from reaction-bonded SiC, as described supra, that has a surface contamination level of less than 1% atomic of boron and less than 1% atomic of phosphorus. The RBSiC may be substantially devoid of boron and phosphorus. As used herein, "substantially devoid" means that that the RBSiC includes a total of less than 2% atomic of boron and phosphorus, such as a total of less than 1% atomic B and P. Advantageously, the RBSiC also has a mobile metal concentration sufficiently low to provide a mobile metal partial pressure less than $1\times10^{-6}$ atmospheres at an operating temperature range of the fluidized bed reactor.

B. Laterally Joined Segments

Figure 7:
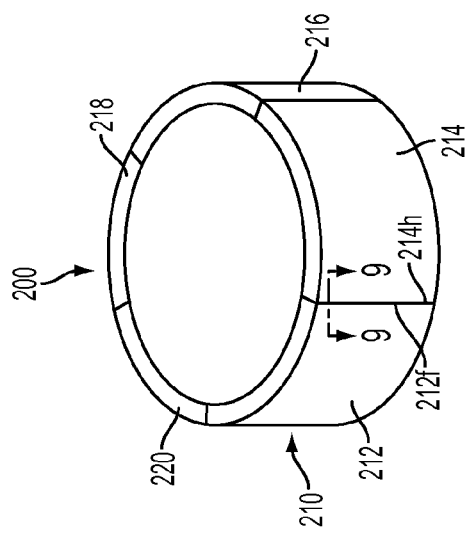
FIG. 7 is a schematic oblique view of a segmented liner including plural laterally joined segments.

A segmented SiC liner 200 for use in a fluidized bed reactor for production of polysilicon-coated granulate material may include at least one tubular wall 210 having an annular outer surface and comprising a plurality of laterally joined SiC segments 212, 214, 216, 218, 220 (FIG. 7). A volume of bonding material is disposed between abutting lateral edge surfaces of each pair of adjacent SiC segments.

The representative liner 200 illustrated in FIG. 7 comprises a tubular wall 210 that includes laterally joined SiC segments 212, 214, 216, 218, 220, each segment having lateral edges and an outer surface that defines a portion of the outer surface of the tubular wall 210. A person of ordinary skill in the art, however, understands that the liner may include more or fewer laterally joined SiC segments. It may be preferable to use fewer segments to reduce contamination from bonding material used to join the segments. However, the number of segments also may be determined in part by handling ease when assembling the liner.

Figure 8:
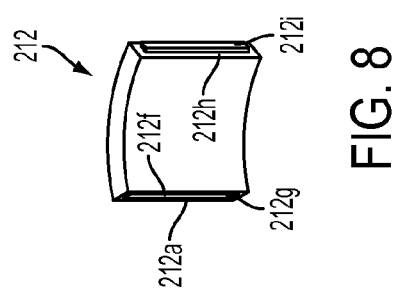
FIG. 8 is a schematic oblique view of one segment of a liner that includes plural laterally joined segments.

As shown in FIG. 8, each SiC segment, e.g., exemplary segment 212, comprises (i) an outer surface 212a defining a portion of the annular outer surface of the tubular wall 210, (ii) a first lateral edge surface 212f defining a laterally opening depression 212g along at least a portion of the length of the first lateral edge surface 212f, and (iii) a second lateral edge surface 212h defining a laterally extending protrusion 212i along at least a portion of the length of the second lateral edge surface 212h. In some embodiments, the depression 212g and protrusion 212i extend along the entire length of the first lateral edge surface 212f and second lateral edge surface 212i, respectively. The depression 212g and the protrusion 212i are female and male joint portions, respectively. In some examples, the joint portions have a tongue-and-groove configuration, wherein the depression 212g corresponds to the groove and the protrusion 212i corresponds to the tongue. In some embodiments, each SiC segment has a lower edge surface that is flat (i.e., the lower edge surface does not include a depression or a protrusion), thereby facilitating a gas-tight seal when the liner is inserted into the fluidized bed reactor chamber.

Figure 9:
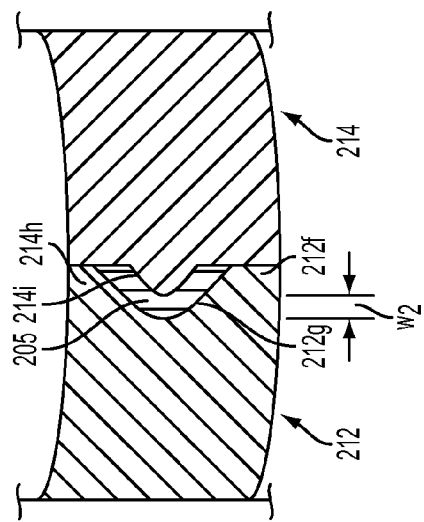
FIG. 9 is schematic partial cross-sectional view, taken along line 9-9 of FIG. 7, showing the boundary between two laterally abutted silicon carbide segments.
Figure 14:
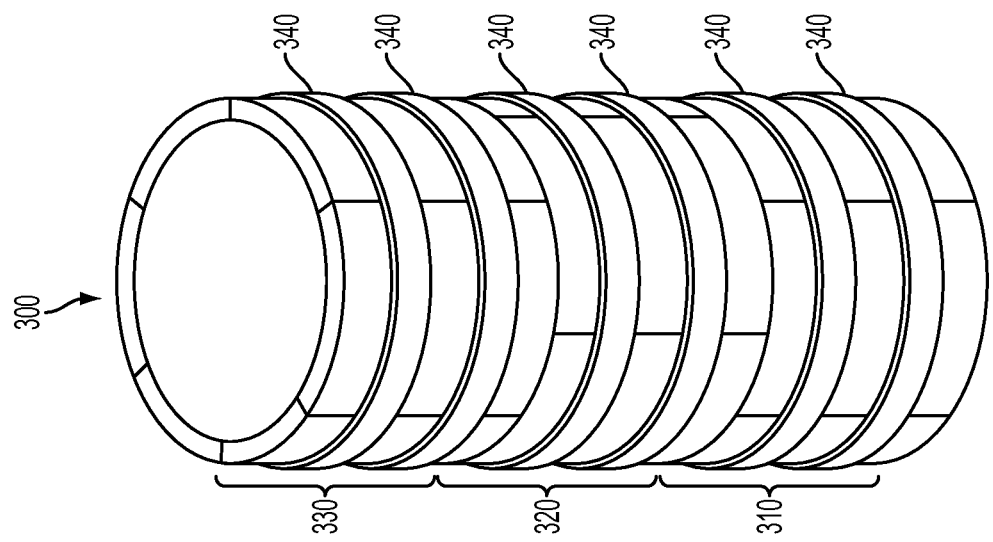
FIG. 14 is a schematic oblique view of the segmented liner of FIG. 11, wherein a plurality of retaining elements surrounds the vertically joined tubular wall segments.

The second lateral edge protrusion 212i of each segment has smaller edge dimensions than the first lateral edge surface depression 212g of each segment. Accordingly, with reference to FIG. 9, when a first lateral edge 212f of a first SiC segment 212 is abutted to a second lateral edge 214h of an adjacent SiC segment 214, the surface of the first segment depression 212g is spaced apart from the surface of the adjacent segment protrusion 214i and a space is located between the first segment depression 212g and the adjacent segment protrusion 214i. A volume of bonding material 205 is disposed within the space between the first segment depression 212g and the adjacent segment protrusion 214i. In some examples, the space has a width $w_2$, measured horizontally, of 0.2-0.8 mm, such as a width of 0.4-0.6 mm. The bonding material 205 is disposed within the space between the first segment depression 212g and the second segment protrusion 214i. In some embodiments, the bonding material comprises 0.4-0.7 wt % lithium as lithium aluminum silicate and silicon carbide as described infra. The bonding material may further comprise aluminum silicate.

In some embodiments, a segmented SiC liner comprises a plurality of alternating SiC segments having laterally opening depressions on both lateral edge surfaces and SiC segments having laterally extending protrusions on both lateral edge surfaces. In other words, segment 212, for example, may have a first lateral edge 212f defining a laterally opening depression 212g and a second lateral edge 212h defining a laterally opening depression 212i. Alternate segments, e.g., segment 214, may have a first lateral edge 214f defining a laterally extending protrusion 212g and a second lateral edge 214h defining a laterally extending protrusion 214i.

One or more of the silicon carbide segments may be formed from reaction-bonded SiC, as described supra, that has a surface contamination level of less than 1% atomic of boron and less than 1% atomic of phosphorus. In some embodiments, the RBSiC is substantially devoid of boron and phosphorus. Advantageously, the RBSiC also has a mobile metal concentration sufficiently low to provide a mobile metal partial pressure less than $1\times10^{-6}$ atmospheres at an operating temperature range of the fluidized bed reactor.

Figure 10:
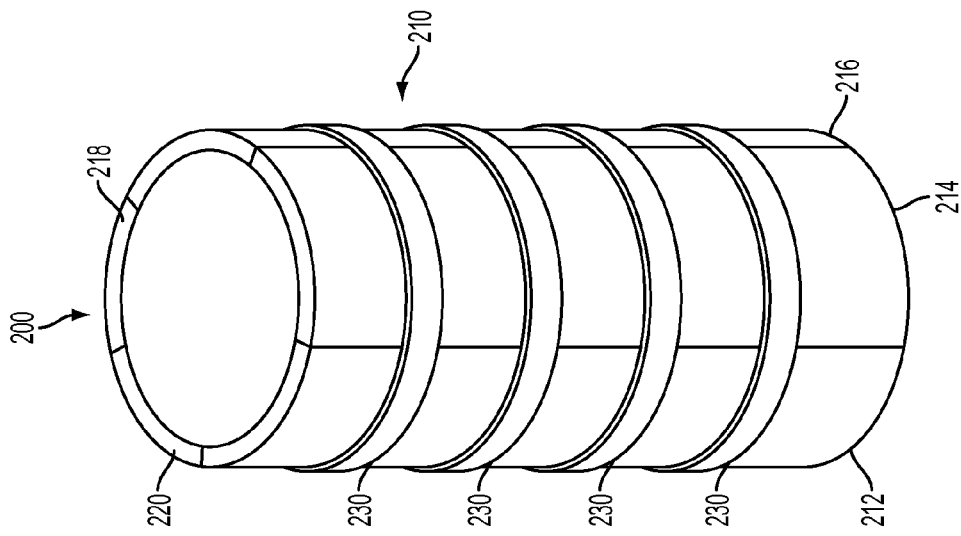
FIG. 10 is a schematic oblique view of a segmented liner including plural vertically abutted segments, each comprised of laterally abutted segments and encompassing retaining elements.

In some embodiments, at least one retaining member 230 extends around the annular outer surface of the tubular wall 210 (FIG. 10). As shown in FIG. 10, a plurality of retaining members 230 may extend around the annular outer surface of tubular wall 210. Desirably, the retaining member 230 is constructed of a material having a linear coefficient of thermal expansion (LCTE) substantially similar to the LCTE of silicon carbide. If the LCTE values of the retaining member and the SiC are significantly different, the retaining member and SiC will have different magnitudes of expansion under operating conditions of the fluidized bed reactor, thereby potentially rendering the retaining member ineffective or fracturing the SiC. The LCTE of SiC is 3.9-4.0× $10^{-6}$/K. In some examples, the retaining member is constructed of a material having a LCTE ranging from 2× $10^{-6}$/K to 6×$10^{-6}$/K, such as a LCTE ranging from 3×$10^{-6}$/K to 5×$10^{-6}$/K or from 3.5×$10^{-6}$/K to 5×$10^{-6}$/K. Suitable materials for the retaining member include, but are not limited to, molybdenum (LCTE=4.9×$10^{-6}$/K) and certain molybdenum alloys (e.g., TZM molybdenum—99.2-99.5 wt % Mo, 0.5 wt % Ti, and 0.08 wt % Zr).

C. Laterally and Vertically Joined Segments

As illustrated in FIG. 11, a segmented SiC liner 300 for use in a fluidized bed reactor for production of polysilicon-coated granulate material may include (i) a first tubular wall 310, also referred to as an initiator wall, having a cylindrical outer surface and comprising a plurality of laterally joined SiC segments (e.g., segments 311, 312, 313), each segment having lateral edges and an outer surface that is a portion of the outer surface of tubular wall 310; (ii) a second tubular wall 320 located above and abutted to the first tubular wall 310, the second tubular wall 320 having a cylindrical outer surface and comprising a plurality of laterally adjacent SiC segments (e.g., segments 321, 322, 323), each segment having lateral edges and an outer surface that is a portion of the outer surface of tubular wall 320; (iii) a volume of the bonding material (not shown) disposed between each pair of adjacent laterally joined SiC segments of the first tubular wall 310; (iv) a volume of the bonding material (not shown) disposed between each pair of adjacent laterally joined SiC segments of the second tubular wall 320; and (v) volume of bonding material comprising a lithium salt, the bonding material (not shown) disposed between the first and second tubular walls 310, 320.

The representative liner 300 illustrated in FIG. 11 includes six laterally joined SiC segments in each tubular wall. For example, tubular wall 330 includes SiC segments 331-336. A person of ordinary skill in the art, however, understands that each tubular wall layer may comprise more or fewer SiC segments. The segments of each tubular wall layer may be positioned such that the lateral edges of each SiC segment are laterally staggered relative to the lateral edges of SiC segments vertically adjacent to the segment. For example, lateral edges 322f, 322h of segment 332 are laterally spaced apart from lateral edges of segments 312, 313 below and segments 332, 333 above. A staggered arrangement advantageously provides additional mechanical strength to the liner 300.

With reference to FIGS. 11 and 12, in some embodiments, each SiC segment, such as exemplary segment 312, of the first tubular wall 310 comprises (i) an outer surface 312a defining a portion of the annular outer surface of the tubular wall 310, (ii) a first tubular wall segment upper edge surface 312b defining an upwardly opening first tubular wall segment depression 312c, (iii) a first lateral edge surface 312f defining a laterally opening depression (not shown) along at least a portion of the length of the first lateral edge surface 312f, and (iv) a second lateral edge surface 312h defining a laterally extending protrusion 312i along at least a portion of the length of the second lateral edge surface 312h, the protrusion 312i having smaller dimensions than the first lateral edge surface depression. In some embodiments, each SiC segment of the first tubular wall 310 has a lower edge surface that is flat (i.e., the lower edge surface does not include a depression or a protrusion), thereby facilitating a gas-tight seal when the liner is inserted into the fluidized bed reactor chamber.

Each SiC segment, such as exemplary segment 322, of the second tubular wall 320 comprises (i) an outer surface 322a defining a portion of the annular outer surface of the tubular wall 320, (ii) a first lateral edge surface 322f defining a laterally opening depression 322g along at least a portion of the length of the first lateral edge surface 322f, (iii) a second lateral edge surface 322h defining a laterally extending protrusion (not shown) along at least a portion of the length of the second lateral edge surface 322h, the protrusion having smaller dimensions than the first lateral edge surface depression 312g, and (iv) second tubular wall segment lower edge surface 322d defining a downwardly extending second tubular wall segment protrusion 322e received within the first tubular wall segment depression 312c and having smaller dimensions than the first tubular wall segment depression 312c. When the first tubular wall segment upper edge surface 312b and the second tubular wall segment lower edge surface 322d are vertically abutted, the surface of the first tubular wall segment depression 312c is spaced apart from the surface of the second tubular wall segment protrusion 322e and a space is located between the second tubular wall segment protrusion 322e and the tubular wall first segment depression 312c. The volume of bonding material disposed between the first and second tubular walls 310, 320 is disposed within the space between the second tubular wall segment protrusion 322e and the tubular wall first segment depression 312c.

Figure 13:
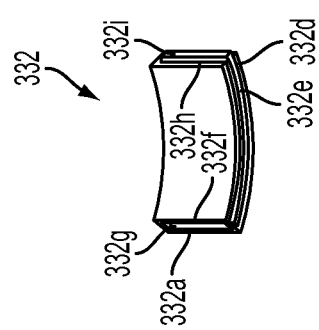
FIG. 13 is a schematic oblique view of one segment of the terminal tubular wall segment of FIG. 11

In some examples, the segmented SiC liner 300 further comprises at least one retaining member 340 extending around the annular outer surface of the first tubular wall 310, and at least one retaining member 340 extending around the annular outer surface of the second tubular wall 320 (FIG. 13). As illustrated in FIG. 13, the segmented SiC liner 300 may include a plurality of retaining members 340 extending around each of the first tubular wall and the second tubular wall.

In some embodiments, each segment of the second tubular wall 320, such as exemplary segment 322, further comprises an upper edge surface 322b that defines an upwardly opening second tubular wall segment depression 322c (FIG. 11).

The segmented SiC liner 300 may further comprise a terminal tubular wall 330 located above and abutted to the second tubular wall 320 (FIGS. 10, 13). The terminal tubular wall 330 comprises a plurality of laterally joined terminal SiC segments (e.g., segments 332, 334, 336). As shown in FIG. 13, each terminal SiC segment, such as exemplary segment 332, comprises (i) a first lateral segment edge surface 332f defining a laterally opening depression 332g along at least a portion of the length of the first lateral segment edge surface 332f, (ii) a second lateral segment edge surface 332h defining a laterally extending protrusion 332i along at least a portion of the length of the second segment lateral edge surface 332h, the protrusion 332i having smaller dimensions than the first segment lateral edge surface depression 332g, and (iii) a segment lower edge surface 332d defining a downwardly extending terminal tubular wall segment protrusion 332e received within the second tubular wall segment depression 322c and having smaller dimensions than the second tubular wall segment depression 322c. When the terminal tubular wall segment lower edge surface 332d and the second tubular wall segment upper edge surface 322b are vertically abutted, the surface of the second tubular wall segment depression 322c is spaced apart from the surface of the terminal tubular wall segment protrusion 332e and a space is located between the terminal tubular wall segment protrusion 332e and the second tubular wall segment depression 322c. A volume of bonding material comprising a lithium salt is disposed within the space between the terminal tubular wall segment protrusion 332e and the second tubular wall segment depression 322c.

In some embodiments, the segmented silicon carbide liner includes one or more additional layers of tubular walls. In the example shown in FIG. 11, the liner 300 comprises three tubular walls 310, 320, 330, each tubular wall comprising a plurality of laterally joined SiC segments, e.g., 312, 314, 316, 322, 324, 326, 332, 334, 336. A person of ordinary skill in the art understands that the segmented liner may include two, three, four, or more than four tubular walls, each tubular wall comprising a plurality of SiC segments. The number of tubular walls is determined, at least in part, by the desired height of the liner and the height of the individual tubular walls. Manufacturing limitations may determine the height of individual SiC segments laterally joined to form the individual tubular walls.

Each additional tubular wall advantageously will have a configuration substantially similar to tubular 320 of FIG. 11. Each additional tubular wall has an annular outer surface and comprises a plurality of laterally joined additional silicon carbide segments. As illustrated in FIG. 12 for representative SiC segment 322, each additional SiC segment comprises (i) an outer surface 322a defining a portion of the annular outer surface of the tubular wall 320, (ii) an upper edge surface 322b that defines an upwardly opening depression 322c, (iii) a lower edge surface 322d defining a downwardly extending protrusion 322e (ii) a first lateral edge surface 322f defining a laterally opening depression 322g along at least a portion of the length of the first lateral edge surface 322f, and (iv) a second lateral edge surface 322h defining a laterally extending protrusion 322i along at least a portion of the length of the second lateral edge surface 322h, the protrusion 322i having smaller dimensions than the first lateral edge surface depression 312g.

V. BONDING MATERIALS

Suitable bonding materials for joining silicon carbide segments (i) provide a joint having sufficient mechanical strength to withstand operating conditions (e.g., vibrational stresses) within a fluidized bed reactor, (ii) are thermally stable at operating temperatures within the FBR when cured, (iii) provide a joint that is at least moderately leak tight for gases, and (iv) do not produce undesirable levels of product contamination. A curable bonding material comprising a lithium salt may provide the desired characteristics.

In some embodiments, the uncured bonding material comprises 2500-5000 ppm lithium, such as from 3000-4000 ppm lithium. In some embodiments, the lithium salt is lithium silicate.

The uncured bonding material may be an aqueous slurry or paste comprising lithium silicate. The bonding material may further comprise a filler material. Desirably, the filler material does not produce significant contamination of the product during FBR operation. Advantageously, the filler material has a thermal coefficient of expansion similar to silicon carbide to reduce or eliminate separation of the bonding material from the SiC surfaces when heated. Suitable filler materials include silicon carbide particles.

The bonding material may also include a thickening agent to provide a desired viscosity. The bonding material advantageously has a spreadable consistency with sufficient viscosity to minimize undesirable running or dripping from coated surfaces. in some embodiments, the bonding material has a viscosity from 3.5 Pa·s to 21 Pa·s at 20° C., such as a viscosity from 5-20 Pa·s, 5-15 Pa·s, or 10-15 Pa·s at 20° C. In some examples, the bonding material includes aluminum silicate powder as a thickening agent. Aluminum silicate is stable at FBR operating temperatures and is not easily reduced by hydrogen. Thus, aluminum silicate is a suitable, non-contaminating thickening agent. In certain embodiments, the bonding material has a suitable viscosity when the aluminum silicate is present in a sufficient concentration to provide 700-2000 ppm aluminum, such as from 1000-1500 ppm aluminum.

When cured, the bonding material may comprise lithium aluminum silicate and silicon carbide, such as 0.4-07 wt % lithium and 93-97 wt % silicon carbide. In some embodiments, the cured bonding material has sufficient strength to provide joints that can withstand a mass load of at least 5 kg.

In some examples, the bonding material is an aqueous slurry comprising 2500-5000 ppm lithium as lithium silicate, 700-2000 ppm aluminum as aluminum silicate, and silicon carbide particles. The slurry has a viscosity from 3.5 Pa·s to 21 Pa·s at 20° C. In certain embodiments, the bonding material is an aqueous slurry comprising 3000-4000 ppm lithium as lithium silicate, 1000-1500 ppm aluminum as aluminum silicate, and silicon carbide powders.

Advantageously, the cured bonding material does not release deleterious quantities of contaminants when exposed to operating conditions within the FBR. In particular, the bonding material does not release significant quantities of boron, phosphorus, or aluminum during FBR operation. Advantageously, the cured bonding material does not release thermally unstable compounds of Group I-VI elements or transition metals during FBR operation. In some embodiments, the uncured bonding material comprises <50 ppm P, <40 ppm P, or <30 ppm P, and <10 ppm B, <5 ppm B, or <1 ppm B.

In some embodiments, the cured bonding material comprises 0.4-0.7 wt % lithium, primarily as lithium aluminum silicate, and silicon carbide. In some embodiments, the cured bonding material comprises 0.4-0.6 wt % lithium, primarily as lithium aluminum silicate, and silicon carbide. In some examples, the cured bonding material comprises 0.4-0.6 wt % lithium, primarily as lithium silicate, and 93-97 wt % silicon carbide. The cured bonding material may further include lithium aluminum silicate, aluminum silicate, cristobalite ($SiO_2$), or a combination thereof. In some examples, the cured bonding material comprises 1.8-2.4 wt % lithium aluminum silicate, 2.0-2.5 wt % aluminum silicate, and 0.4-0.8 wt % cristobalite. In certain examples, the cured bonding material included 0.5 wt % lithium as determined by the x-ray diffraction pattern of the cured phase and by using the standard reference intensity ratio (RIR) phase quantification method (R. Jenkins and R. L. Snyder, *Introduction to X-Ray Powder Diffractometry*, John Wiley & Sons, Inc., 1996, p. 374). In one embodiment, the cured bonding material contained 0.5 wt % lithium as lithium aluminum silicate, 95 wt % silicon carbide, 2.1 wt % lithium aluminum silicate, 2.3 wt % aluminum silicate, and 0.6 wt % cristobalite.

VI. PREPARATION OF SEGMENTED SILICON CARBIDE LINERS

Two silicon carbide segments are joined by applying a bonding material as disclosed herein to at least a portion of an edge surface of a first silicon carbide segment to form a coated edge surface. At least a portion of the edge surface of the first silicon carbide segment is brought into abutment with at least a portion of an edge surface of a second silicon carbide segment with at least a portion of the bonding material positioned between the abutting edge surfaces of the first silicon carbide segment and the second silicon carbide segment. Heat is then applied to the bonding material to form bonded first and second silicon carbide segments. Heating may be performed in an atmosphere substantially devoid of hydrocarbons, e.g., in air or nitrogen. Embodiments of the disclosed bonding material form a sufficient bond after heating without the requirement of a cooling step.

In some examples, bonding material is applied to at least a portion of an edge surface of the first SiC segment and at least a portion of an edge surface of the second SiC segment. The bonding material is applied to the edge surface(s) by any suitable process including spreading, squeezing, wiping, or brushing the bonding material onto the edge surface(s). In some examples, the bonding material is applied using a spatula, a syringe, or a squeezable bag with an aperture or attached nozzle. After bringing the edge surfaces of the first and second SiC segments into abutment, excess bonding material is removed, such as by wiping, before heating the SiC segments to cure the bonding material. Advantageously, the abutted edges of the first and second SiC segments define male and female joint portions (e.g., a protrusion and a depression) cooperatively dimensioned to provide a space between the male and female joint portions when the edges are abutted, wherein the bonding material is disposed within the space.

Applying heat to the bonding material may include two or more heating steps. In some embodiments, applying heat comprises exposing the bonding material to an atmosphere at a first temperature T1 for a first period of time, increasing the temperature to a second temperature T2, wherein T2>T1, and exposing the bonding material to the second temperature T2 for a second period of time to cure the bonding material. Heating is performed in an atmosphere substantially devoid of hydrocarbons, such as in air or in a nitrogen atmosphere. Heat may be applied to the bonding material, or to the bonding material and the abutted first and second SiC segments. Heating both the bonding material and the abutted SiC segments advantageously minimizes differences in material expansion and contraction during heating and cooling, thereby reducing likelihood of cracking or separation of the components.

The first temperature T1 and first period of time are sufficient to vaporize water from the bonding material. The first temperature T1 desirably is sufficiently low to avoid boiling the water or cracking the bonding material as it dries. In some examples, T1 is within the range of 90-110° C., such as within the range of 90-100° C. or 90-95° C. The first period of time is at least one hour, such as at least two hours or 2-4 hours. The temperature is gradually increased from ambient temperature to T1 and then maintained at T1 for the first period of time. The temperature may be increased at a rate of 1-4° C./minute, such as a rate of 2-3° C./minute. In some instances, the temperature was increased from ambient temperature to 93-94° C. at a rate of 2-3° C./minute, and maintained at 93-94° C. for 2 hours under nitrogen flow.

The second temperature T2 is within the range of 250-350° C., such as within the range of 250-300° C., 250-275° C. or 255-265° C. The second period of time is at least one hour, such as at least two hours or 2-4 hours. The temperature is gradually increased from T1 to T2, and then maintained at T2 for the second period of time. The temperature may be increased at a rate of 3-8° C./minute, such as a rate of 5-6° C./minute. In some instances, the temperature was increased from T1 to 260° C. at a rate of 5-6° C./minute and maintained at 260° C. for 2 hours under nitrogen flow.

Optionally, the joined SiC segments may be further heated from the second temperature T2 to a third temperature T3 and maintained at T3 for a third period of time. The temperature T3 is be within the range of 350-450° C., such as within the range of 350-400° C., 360-380° C. or 370-375° C. The third period of time is at least one hour, such as at least two hours or 2-4 hours. The temperature is gradually increased from T1 to T2, and then maintained at T2 for the second period of time. The temperature may be increased at a rate of 7-10° C./minute, such as a rate of 8-9° C./minute.

In some embodiments, the abutted first and second SiC segments are allowed to dry for an initial period of time at ambient temperature before applying heat. In some examples, an initial period of drying is performed in air at ambient temperature. The initial period of drying may be performed in sunlight. Without wishing to be bound by any particular theory of operation, an initial period of drying in ambient temperature, such as at ambient temperature in sunlight, facilitates slow diffusion of solvent (e.g., water) from the bonding material without leaving air pockets or defects within the joint and provides additional contact time between the bonding material and the SiC surfaces. The bond between the bonding material and the SiC surface may be strengthened by SiC surface roughness or alkali attack of lithium ions on free silicon on the SiC surface when the SiC is reaction-bonded SiC, which includes free silicon between the SiC particles. When the free silicon is exposed to lithium ions in an air atmosphere, Si—O surface species are created. During subsequent curing (at temperatures T2 and, optionally, T3), the Si—O bond reacts with silicates in the bonding material to form a three-dimensional silica network between the abutted SiC segments.

VII. EXAMPLES

Example 1

Evaluation of Bonding Materials

Potassium silicate and lithium silicate-based bonding materials are commercially available, e.g., Ceramabond 890-K and 890-L, where K and L refer to potassium and lithium, respectively (Aremco Products, Inc., Valley Cottage, N.Y.). Both bonding materials included fine silicon carbide particles as fillers and aluminum silicate as a thickening agent. The bonding materials were available as premixed slurries.

Each bonding material was mixed thoroughly before use by shaking for 5 minutes or stirring with a mechanical stirrer. Silicon carbide joint surfaces were cleaned with a metal brush and wiped clean with a clean cloth. Bonding material was applied to matching male and female joints (i.e., tongue-and-groove joints) using a spatula. Excess bonding material was wiped off. Typically, three pairs of silicon carbide segments (5-8 cm in length) were tested per set of conditions to ensure repeatability. The male and female joints were pressed and clamped together. The clamped joints were dried for 2 hours at room temperature. In some cases, the clamped joints were dried in sunlight for 2 hours.

The joints subsequently were placed into a muffle furnace. The temperature was ramped from room temperature to 93°

C. at a rate of 2.8° C./minute and maintained at 93° C. for 2 hours under nitrogen flow. The temperature then was increased from 93° C. to 260° C. at a rate of 5.6° C./minute, and maintained at 260° C. for 2 hours under nitrogen flow. When the bonding material included potassium silicate (Ceramabond 890-K, the temperature subsequently was increased from 260° C. to 371° C. at a rate of 8.3° C./minute, and maintained at 371° C. for 2 hours under nitrogen flow.

A simple lever arm rig was used for comparing the joint strength of the cured, bonded SiC segments in a repeatable manner. One SiC segment of a joined pair was held in a clamp. A mass was hung from the other SiC segment of the joined pair. Masses up to 5 kg were used. For each measurement, the lever arm distance (distance between the hang point for the mass at the joint) was kept constant for all measurements.

Both bonding materials formed joints that easily withstood a 5-kg mass load. Attempts to break each joint by hand demonstrated that joints formed with the lithium silicate-based bonding material could be broken with a moderate-to-strong force. The joints formed with the potassium silicate-based joints could not be broken by hand.

Although the potassium silicate-based bonding material was stronger, thermodynamic equilibrium calculations predicted that potassium would vaporize and contaminate the silicon product during fluidized bed reactor operation. Similar calculations for the lithium silicate-based bonding material predicted that the binder would be stable under the conditions with the fluidized bed reactor and would not vaporize to any significant degree. Tests completed in a fluidized bed reactor confirmed the predictions. Although potassium contamination occurred with the potassium silicate-based bonding material, no significant lithium level was detected in the silicon product when the lithium silicate-based bonding material was used.

X-ray diffraction analysis was performed for the cured potassium silicate-based bonding material. The XRD analysis showed a mixture of silicon carbide polymorphs 4H and 6H. Minor amounts of two aluminosilicate phases and cristobalite ($SiO_2$, tetragonal) were also detected.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A process for constructing a silicon carbide liner for a fluidized bed reactor for production of polysilicon-coated granulate material, comprising:
    forming at least one coated edge surface by applying a bonding material comprising a lithium salt to at least a portion of an edge surface of a first silicon carbide segment;
    bringing the at least a portion of the edge surface of the first silicon carbide segment into abutment with at least a portion of an edge surface of a second silicon carbide segment with at least a portion of the bonding material positioned between the abutting edge surfaces of the first silicon carbide segment and the second silicon carbide segment; and
    applying heat to the bonding material, in an atmosphere devoid of hydrocarbons, to cure the bonding material and form bonded first and second silicon carbide segments, wherein the bonding material after curing comprises 0.4-0.7 wt % lithium as lithium aluminum silicate and silicon carbide.

2. The process of claim 1, wherein the silicon carbide is reaction-bonded silicon carbide that has a surface contamination level of less than 1% atomic of phosphorus and less than 1% atomic of boron, and has a mobile metal concentration sufficiently low to provide a metal partial pressure less than 0.1 Pa in the fluidized bed reactor for each mobile metal within the operating temperature range of the polysilicon fluidized bed reactor.

3. The process of claim 2, wherein the mobile metal concentration is the concentration of aluminum, chromium, iron, copper, magnesium, calcium, sodium, nickel, tin, zinc, and molybdenum.

4. The process of claim 1, wherein the bonding material has a viscosity from 3.5 Pa·s to 21 Pa·s at 20° C.

5. The process of claim 1, wherein the bonding material is an aqueous slurry comprising 2500-5000 ppm lithium as lithium silicate and silicon carbide particles.

6. The process of claim 5, wherein the bonding material further comprises aluminum silicate.

7. The process of claim 1, wherein applying heat comprises:
    exposing the abutted first and second silicon carbide segments to an atmosphere at a first temperature T1 for a first period of time;
    increasing the temperature to a temperature T2, and
    exposing the abutted first and second silicon carbide segments to the second temperature T2, wherein T2>T1, for a second period of time to cure the bonding material.

8. The process of claim 7, wherein:
    the first temperature T1 is 90-110° C. and the first period of time is at least two hours; and
    the second temperature T2 is 250-350° C. and the second period of time is at least two hours.

9. The process of claim 1, further comprising allowing the abutted first and second silicon carbide segments to dry for an initial period of time at ambient temperature in air before applying heat.

10. The process of claim 9, wherein the initial period of time is at least one hour.

11. A silicon carbide liner for use in a fluidized bed reactor for production of polysilicon-coated granulate material, the liner comprising:
    a first silicon carbide segment;
    a second silicon carbide segment abutted to the first silicon carbide segment; and
    a bonding material positioned between abutting edge surfaces of the first and second silicon carbide segments, the bonding material comprising 0.4-0.7 wt % lithium as lithium aluminum silicate and silicon carbide.

12. The silicon carbide liner of claim 11, wherein the bonding material comprises 93-97 wt % silicon carbide.

13. The silicon carbide liner of claim 11, wherein the silicon carbide is reaction-bonded silicon carbide that has a surface contamination level of less than 1% atomic of phosphorus and less than 1% atomic of boron, and has a mobile metal concentration sufficiently low to provide a mobile metal partial pressure less than $1 \times 10^{-6}$ atmospheres at an operating temperature range of the fluidized bed reactor.

14. The silicon carbide liner of claim 11, wherein the bonding material further comprises aluminum silicate.

15. The silicon carbide liner of claim 14, wherein:
one of an edge surface of the first silicon carbide segment and an adjacent edge surface of the second silicon carbide segment defines a female joint portion; and
the other of the edge surface of the first silicon carbide segment and the adjacent edge surface of the second silicon carbide segment defines a male joint portion cooperatively dimensioned to fit with the female joint portion.

16. A fluidized bed reactor for production of polysilicon-coated granulate material, comprising:
a vessel having an outer wall; and
a silicon carbide liner as defined in claim 11, the liner positioned inwardly of the outer wall such that the inwardly facing surface of the liner defines a portion of a reaction chamber.

17. The fluidized bed reactor of claim 16, further comprising:
at least one heater positioned between the outer wall and the segmented silicon carbide liner;
at least one inlet having an opening positioned to admit a primary gas comprising a silicon-bearing gas into the reaction chamber;
a plurality of fluidization gas inlets, wherein each fluidization gas inlet has an outlet opening into the reaction chamber; and
at least one outlet for removing polysilicon-coated granulate material from the vessel.

18. The fluidized bed reactor of claim 17, wherein the silicon carbide is reaction-bonded silicon carbide that is substantially devoid of boron and phosphorus, and has a mobile metal concentration sufficiently low to provide a mobile metal partial pressure less than $1 \times 10^{-6}$ atmospheres at an operating temperature range of the polysilicon fluidized bed reactor.

19. A process for the production of polysilicon-coated granulate particles, the process comprising flowing a silicon-containing gas through a fluidized bed reactor containing a seed particle within a reactor chamber defined by the fluidized bed reactor to effect pyrolysis of the silicon-containing gas and deposition of a polycrystalline silicon layer on the seed particle to form a polysilicon-coated particle, wherein the fluidized bed reactor comprises a silicon carbide liner as defined in claim 11, the liner being positioned inwardly of the outer wall such that the inwardly facing surface of the liner defines a portion of a reaction chamber.

20. The process of claim 19, wherein the seed particle comprises silicon.

* * * * *